United States Patent
Shih

(10) Patent No.: US 9,401,318 B2
(45) Date of Patent: Jul. 26, 2016

(54) QUAD FLAT NO-LEAD PACKAGE AND MANUFACTURING METHOD THEREOF

(71) Applicant: ChipMOS Technologies Inc., Hsinchu (TW)

(72) Inventor: Chi-Jin Shih, Hsinchu (TW)

(73) Assignee: ChipMOS Technologies Inc., Hsinchu (TW)

( * ) Notice: Subject to any disclaimer, the term of this patent is extended or adjusted under 35 U.S.C. 154(b) by 0 days.

(21) Appl. No.: 14/656,631

(22) Filed: Mar. 12, 2015

(65) Prior Publication Data

US 2015/0294925 A1  Oct. 15, 2015

(30) Foreign Application Priority Data

Apr. 10, 2014  (TW) .............................. 103113159 A

(51) Int. Cl.
*H01L 23/495* (2006.01)
*H01L 23/00* (2006.01)
*H01L 21/56* (2006.01)
*H01L 21/48* (2006.01)
*H01L 23/31* (2006.01)

(52) U.S. Cl.
CPC ...... *H01L 23/49503* (2013.01); *H01L 21/4832* (2013.01); *H01L 21/4842* (2013.01); *H01L 21/56* (2013.01); *H01L 23/49541* (2013.01); *H01L 24/09* (2013.01); *H01L 23/3107* (2013.01); *H01L 24/32* (2013.01); *H01L 24/45* (2013.01); *H01L 24/48* (2013.01); *H01L 24/49* (2013.01); *H01L 24/83* (2013.01); *H01L 24/85* (2013.01); *H01L 24/92* (2013.01); *H01L 2224/04042* (2013.01); *H01L 2224/32245* (2013.01); *H01L 2224/45139* (2013.01); *H01L 2224/45144* (2013.01);

(Continued)

(58) Field of Classification Search
CPC .................. H01L 23/49503; H01L 23/49568; H01L 2225/1029
USPC .................... 257/675, 666, E23.031, E23.051
See application file for complete search history.

(56) References Cited

U.S. PATENT DOCUMENTS 5,866,948 A * 2/1999 Murakami ............ H01L 21/486
                                                    257/778
6,777,788 B1 * 8/2004 Wan ........................ H05K 3/341
                                                    174/528

(Continued)

FOREIGN PATENT DOCUMENTS

TW         544883 B    8/2003
TW      201123383 A    7/2011

OTHER PUBLICATIONS

Office Action from Taiwan Patent Application No. 103113159 dated Mar. 22, 2016.

*Primary Examiner* — Nitin Parekh
(74) *Attorney, Agent, or Firm* — Patterson & Sheridan, LLP

(57) ABSTRACT

A quad flat no-lead package includes an encapsulant, and a plurality of chip pads, a plurality of bond pads and a chip disposed in the encapsulant. Each chip pad is connected to at least one of the chip pads adjacent thereto by a first extending portion. The chip pads and the bond pads are arranged in an array. The chip pads are disposed at the center of the array and the bond pads are disposed around the chip pads. Each of the bond pads and at least one of the bond pads or one of the chip pads adjacent thereto each has a second extending portion formed therebetween and corresponding to each other. Every two of the second extending portions corresponding to each other are separated by a groove. The chip is mounted on a top surface of the chip pads and is electrically coupled to the bond pads.

7 Claims, 4 Drawing Sheets

(52) U.S. Cl.
CPC ............... *H01L 2224/45147* (2013.01); *H01L 2224/45164* (2013.01); *H01L 2224/48091* (2013.01); *H01L 2224/48247* (2013.01); *H01L 2224/48257* (2013.01); *H01L 2224/491* (2013.01); *H01L 2224/49112* (2013.01); *H01L 2224/73265* (2013.01); *H01L 2224/83101* (2013.01); *H01L 2224/83385* (2013.01); *H01L 2224/92247* (2013.01); *H01L 2924/181* (2013.01)

(56) References Cited

U.S. PATENT DOCUMENTS

| | | | |
|---|---|---|---|
| 7,087,462 B1 * | 8/2006 | Park | H01L 21/561 257/666 |
| 7,132,315 B2 * | 11/2006 | Minamio | H01L 21/565 257/666 |
| 8,575,732 B2 * | 11/2013 | Sirinorakul | H01L 21/561 257/666 |
| 2003/0164554 A1 * | 9/2003 | Fee | H01L 21/4842 257/787 |
| 2003/0178708 A1 * | 9/2003 | Minamio | H01L 21/4842 257/666 |
| 2004/0080026 A1 * | 4/2004 | Minamio | H01L 21/565 257/666 |
| 2004/0159918 A1 * | 8/2004 | Lee | H01L 23/3107 257/670 |
| 2009/0085177 A1 * | 4/2009 | Pisigan | H01L 21/4832 257/666 |
| 2010/0149773 A1 * | 6/2010 | Said | H01L 21/561 361/783 |
| 2012/0126378 A1 * | 5/2012 | San Antonio | H01L 21/561 257/659 |
| 2013/0249065 A1 * | 9/2013 | Do | H01L 21/4832 257/666 |

* cited by examiner

QUAD FLAT NO-LEAD PACKAGE AND MANUFACTURING METHOD THEREOF

BACKGROUND OF THE INVENTION

1. Field of the Invention

The invention relates to a quad flat no-lead package and manufacturing method thereof, more particularly, to a quad flat no-lead package and manufacturing method thereof having a lead frame with universal applicability and applicable to a variety of chip sizes and pin configurations for increasing the pin counts.

2. Description of the Prior Art

Quad flat no-lead packages are widely applied in semiconductor chip packaging due to their low cost, the ability to be applied in the surface mount technology (SMT) of the printed circuit board, and the smaller thickness. However, since the contact pads of the QFN package are disposed around the edges of the package, and the spacing between the contact pads is limited to a certain degree due to the capability restriction of the surface mount technology, the quantity of the contact pads cannot be effectively increased within a certain package footprint area. In other words, increasing the number of pins would increase the package footprint area, which restricts the application of QFN packages in high pin-count packages. In addition, different designs are required for the lead frames to comply with various chip sizes; thus the lead frames are incapable for universal use or modularization so that flexibility in design and manufacturing is lacking.

To meet the requirements of lightness, thinness and compactness for the present products, it has long been a goal of research in semiconductor packaging to achieve the maximum performance within a limited packaging space. Therefore, increasing the quantity of the contact pads without affecting the packaging area/volume has become an important topic for research in the field of semiconductor packaging. Furthermore, modularization and universal applicability of the design in the packages have also become the trend in this field.

SUMMARY OF THE INVENTION

One aspect of the present invention is to provide a quad flat no-lead package and the manufacturing method thereof, in which the quantity of the bond pads can be increased without affecting the package area/volume.

Another aspect of the present invention is to provide a quad flat no-lead package and the manufacturing method thereof, which can be applicable to a variety of chip sizes and pin counts, and in which the lead frame has the advantages of modularization and universal applicability.

According to an embodiment of the present invention, the present invention provides a quad flat no-lead package according to the above and other aspects. The quad flat no-lead package comprises an encapsulant, a plurality of chip pads, a plurality of bond pads, and a chip. The encapsulant has a package bottom surface. The plurality of chip pads are disposed in the encapsulant, wherein each of the chip pads is connected to at least one of the chip pads adjacent thereto by a first extending portion, and a bottom surface of the chip pads is exposed on the package bottom surface. The plurality of bond pads are disposed in the encapsulant, wherein the chip pads and the bond pads are arranged in an array, the chip pads are disposed at the center of the array and the bond pads are disposed around the chip pads. Each of the bond pads and at least one of the bond pads or one of the chip pads adjacent thereto each has a second extending portion formed therebetween and corresponding to each other. Every two of the second extending portions corresponding to each other are separated by a groove, and the groove exposes to one end of each of the second extending portions. A bottom surface of the bond pads is exposed on the package bottom surface. A chip is disposed in the encapsulant and mounted on a top surface of the chip pads away from the package bottom surface. The chip is electrically coupled to the bond pads.

According to another embodiment of the present invention, the present invention provides a lead frame adapted to a quad flat no-lead package. The lead frame comprises a plurality of pads. The plurality of pads are arranged in an array, wherein each of the pads is connected to at least one of the pads adjacent thereto by an extending portion. Every two of the extending portions adjacent to each other are separated by one of the pads or a space. A thickness of the extending portions is smaller than a thickness of the pads.

According to yet another embodiment of the present invention, the present invention provides a semiconductor packaging method applicable to a quad flat no-lead package. The semiconductor packaging method comprises the following steps. A lead frame is provided. The lead frame has a plurality of pads arranged in an array, wherein each of the pads is connected to at least one of the pads adjacent thereto by an extending portion, and every two of the extending portions adjacent to each other are separated by one of the pads or a space. A thickness of the extending portions is smaller than a thickness of the pads. A chip is mounted on a portion of the pads near the center of the pads. The pads that the chip is bonded thereon are defined as a plurality of chip pads, and the rest of the pads as a plurality of bond pads. The chip is electrically coupled to the bond pads. The chip, the chip pads and the bond pads are covered by an encapsulant, wherein the encapsulant exposes a surface of the chip pads, a surface of the bond pads and a surface of the extending portions. The extending portions between the chip pads and the bond pads and between the bond pads are partially removed so that the chip pads and the bond pads are electrically isolated, and the bond pad are electrically isolated with each other.

For the quad flat no-lead package and the manufacturing method thereof of the present invention, the bond pads are arranged in an array, thus the quantity of the bond pads can be increased without affecting the package area/volume.

For the quad flat no-lead package and the manufacturing method thereof of the present invention, the chip pads and the bond pads are all arranged in an array, thus the quantities of the chip pads and the bond pads can be adjusted according to the chip sizes and the quantity of I/O contacts required, namely they are applicable to a variety of chip sizes and pin counts. Therefore, the lead frame of the present invention has the advantages of modularization and universal applicability.

BRIEF DESCRIPTION OF THE APPENDED DRAWINGS

DETAILED DESCRIPTION OF THE INVENTION

In order to allow the advantages, spirit and features of the present invention to be more easily and clearly understood, the embodiments and appended drawings thereof are discussed in the following. However, the present invention is not limited to the embodiments and appended drawings.

Figure 1:
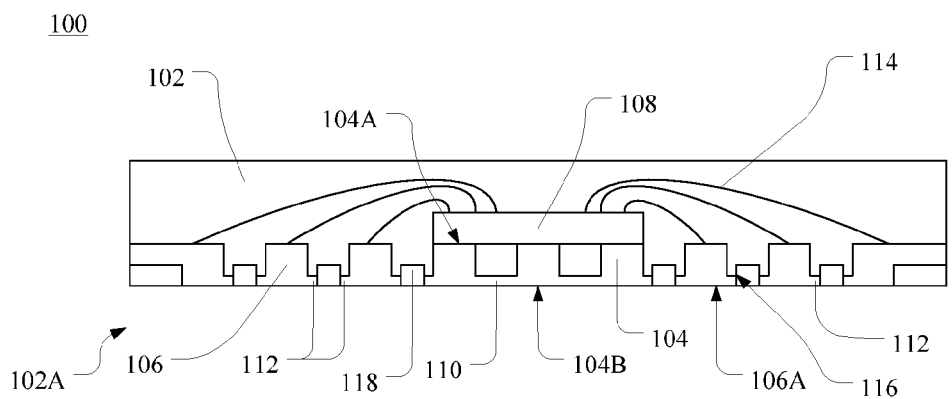
FIG. 1 is a schematic cross sectional view illustrating a quad flat no-lead package according to one embodiment of the present invention.

Please refer to FIG. 1, which is a schematic cross sectional view illustrating a quad flat no-lead package according to one embodiment of the present invention. In some embodiments, the quad flat no-lead package 100 of the present invention comprises an encapsulant 102, a plurality of chip pads 104, a plurality of bond pads 106, and a chip 108. The encapsulant 102 has a package bottom surface 102A, and the material thereof may be epoxy resin, for example. The chip pads 104 are disposed in the encapsulant 102. Each of the chip pads 104 is connected to at least one of the chip pads 104 adjacent thereto by a first extending portion 110 so that the plurality of the chip pads 104 are interconnected together. A bottom surface 104B of the chip pads 104 is exposed on the package bottom surface 102A. The bond pads 106 are disposed in the encapsulant 102. It is worth mentioning that the chip pads 104 and the bond pads 106 are originally the components of a same lead frame and are connected to each other. After a separation step, the chip pads 104 and the bond pads 106 are separated from each other, and each of the bond pads 106 is separated from each other. The related structures and processes will be described in detail in the embodiments below. The chip pads 104 and the bond pads 106 are arranged in an array, where the chip pads 104 are disposed at the center of the array and the bond pads 106 are disposed around the chip pads 104. Each of the bond pads 106 and at least one of the adjacent bond pads 106 or one of the adjacent chip pads 104 each has a second extending portion 112 formed therebetween and corresponding to each other. Every two of the second extending portions 112 corresponding to each other are separated by a groove 116, where the groove exposes one end of each of the second extending portions 112. In other words, the chip pads 104 and the bond pads 106 and the bond pads 106 themselves are originally connected to each other. After a separation step, the residual second extending portions 112 are formed on the bond pads 106 and a portion of the chip pads 104 respectively. An insulating material 118 can be selectively filled into the grooves 116, and the material of the insulating material 118 can be solder resist, polyimide, etc.

The bottom surface 106A of the bond pads 106 is also exposed on the package bottom surface to serve as the external contacts of the quad flat no-lead package 100. The chip 108 is disposed in the encapsulant 102 and mounted on a top surface 104A of the chip pads 104 that is away from the package bottom surface 102A. The chip 108 is electrically coupled to the bond pads 106, for example, through bonding wires 114. The bonding wires 114 can be made of a material such as gold, copper, silver, palladium or any alloys thereof, and electrically couple the contact pads (not illustrated) of the chip 108 to the bond pads 106.

In the embodiment of the present invention, the bottom surfaces of the first extending portions 110 and the second extending portions 112 are also exposed on the package bottom surface 102A, as shown in FIG. 1. In other words, the portions originally connecting the chip pads 104 and the bond pads 106 corresponding to the package bottom surface 102A. As shown in FIG. 1, the thickness of the first extending portions 110 is smaller than the thickness of the chip pads 104, and the thickness of the portions originally connecting the bond pads 106, namely the thickness of the second extending portions 112, is smaller than the thickness of the bond pads 106. Whereby, the portions connecting the bond pads 106 can be easily removed and disconnected during the separation step. It is worth mentioning that in order to stably secure the chip 108 the first extending portions 110 between the chip pads 104 are preferably to remain connected and unremoved; however, depending on the actual requirements, they can also be partially removed selectively to have a portion of the chip pads 104 being separated from each other.

Figure 2:
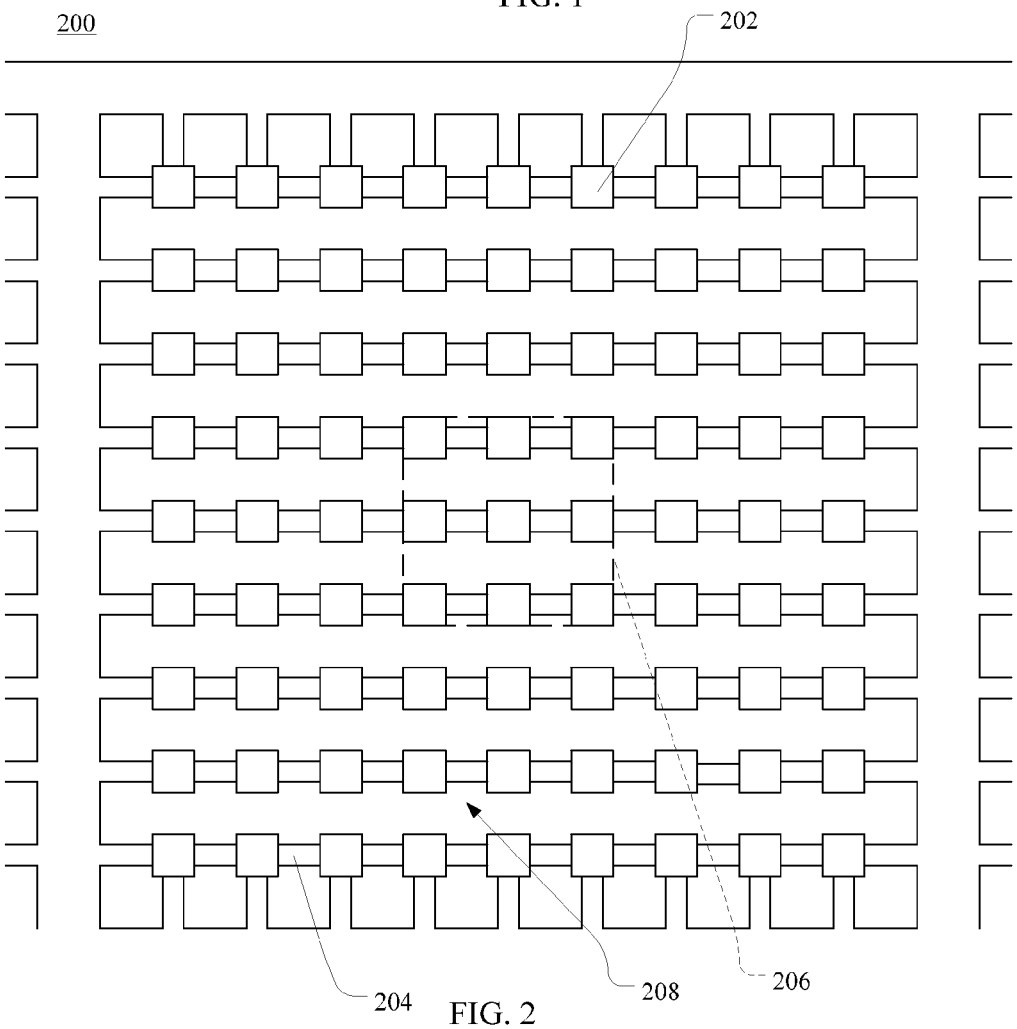
FIG. 2 is a top view illustrating a lead frame according to one embodiment of the present invention.
Figure 3:
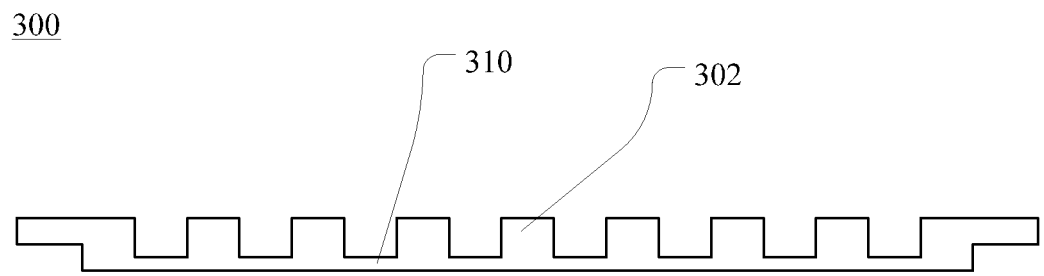
FIG. 3 to FIG. 7 are schematic cross sectional views illustrating each step of the semiconductor packaging method according to one embodiment of the present invention.

Please refer to FIG. 2, which is a top view illustrating a lead frame according to one embodiment of the present invention. As described above, the chip pads 104 and the bond pads 106 in FIG. 1 are originally the components of a same lead frame and are connected to each other. In some embodiments of the present invention, a lead frame 200 adapted to a quad flat no-lead package comprises a plurality of pads 202 arranged in an array. Each of the pads 202 is connected to at least one of the pads 202 adjacent thereto by an extending portion 204. Every two of the adjacent extending portions 204 are separated from each other rather than being a whole piece connecting all pads 202. As shown in FIG. 2, the adjacent extending portions 204 are not directly connected to each other but are separated by a pad 202 or a space 208. The manner of the extending portions 204 connecting the pads 202 is not limited to that shown in FIG. 2. For example, the extending portions 204 connect the pads 202 in lateral direction as shown in FIG. 2; however, they can be connected in a vertical manner, staggered laterally and vertically in a stepwise manner, or in a ring-like manner. The pads 202 can be connected in any manner as long as there is at least one extending portion 204 connected between the pads 202 to provide sufficient support. As shown in FIG. 2, the region 206 demarcated by the dotted line corresponds to the location of the chip pads 104 in FIG. 1. As described above, it can depend on the actual requirements to define the pads 202 used to fasten the chip as the chip pads and the pads 202 serving as the external contacts of the quad flat no-lead package 100 as the bond pads. Therefore, as mentioned above, the chip pads are roughly disposed at the center of the array, and the bond pads are disposed around the chip pads. The quantities of the chip pads and the bond pads can be adjusted according to the chip sizes and the pin counts. Thus, the lead frame of the present invention has the advantages of modularization and universal applicability.

In order for the extending portions 204 to be partially removed easily in the subsequent separation step, the thickness of the extending portions 204 is smaller than the thickness of the pads 202, as shown in FIG. 1, and the width of the extending portions 204 is smaller than the width of the pads 202. The bottom surface of the pads 202 is coplanar with the bottom surface of the extending portions 204.

Please refer to FIG. 3 to FIG. 7, which are schematic cross sectional views illustrating each step of the semiconductor packaging method according to an embodiment of the present invention. First, referring to FIG. 3, in some embodiments of the present invention, the semiconductor packaging method of the present invention can be applied to a quad flat no-lead package. A lead frame 300 having a plurality of pads 302 is provided. The pads 302 are arranged for example in an array, as shown in FIG. 2, wherein each of the pads 302 is connected to at least one of the pads 302 adjacent thereto by an extending portion 310. Every two of the extending portions 310 adjacent to each other are separated by a pad 302 or a space, as shown in FIG. 2, and the thickness of the extending portions 310 is smaller than the thickness of the pads 302.

Figure 4:
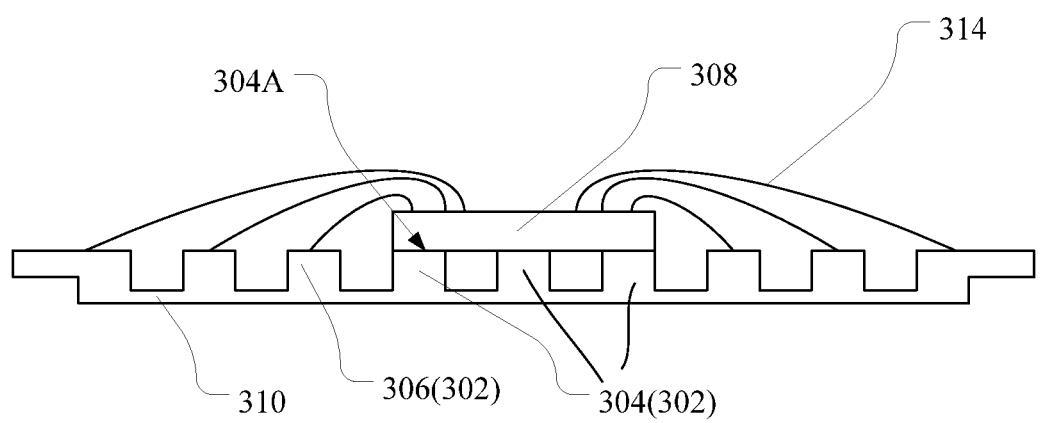

Referring to FIG. 4, a chip 308 is mounted on a portion of the pads 302 near the center of the pads. The pads 302 that the chip 308 is bonded thereon are defined as chip pads 304, and the rest of the pads 302 as bond pads 306. The chip 308 is bonded to the upper surfaces 304A of the chip pads 304 with the rear surface thereof, for example, via a die attach film (DAF) or a tape. Then, the chip 308 is electrically coupled to the bond pads 306 outside the chip pads 304, for example, by bonding the contact pads (not shown) of the chip 308 to the bond pads 306 with the bonding wires 314. The bonding wires 314 can be made of a material such as gold, copper, silver, palladium or any alloys thereof.

Figure 5:
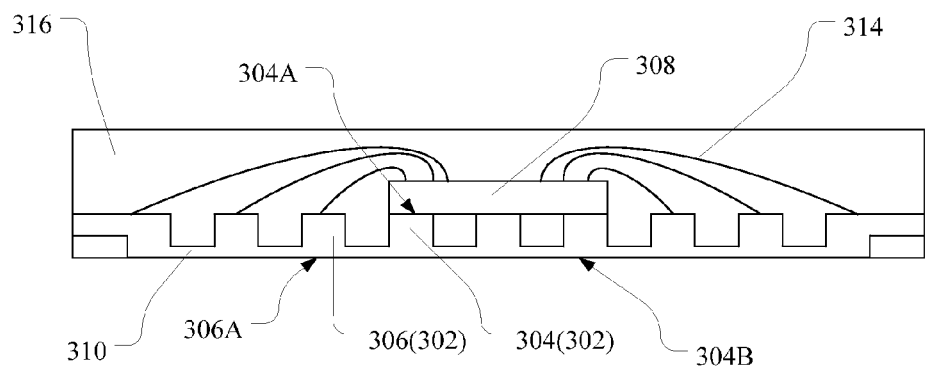

Next, referring to FIG. 5, an encapsulation step is performed. An encapsulant 316 is formed to cover the chip 308, the chip pads 304, the bonding wires 314 and the bond pads 306, and the encapsulant 316 exposes the bottom surfaces 304B, 306A, 310A of the chip pads 304, the bond pads 306 and the extending portions 310. The encapsulant 316 can be made of a material such as epoxy resin.

Figure 6:
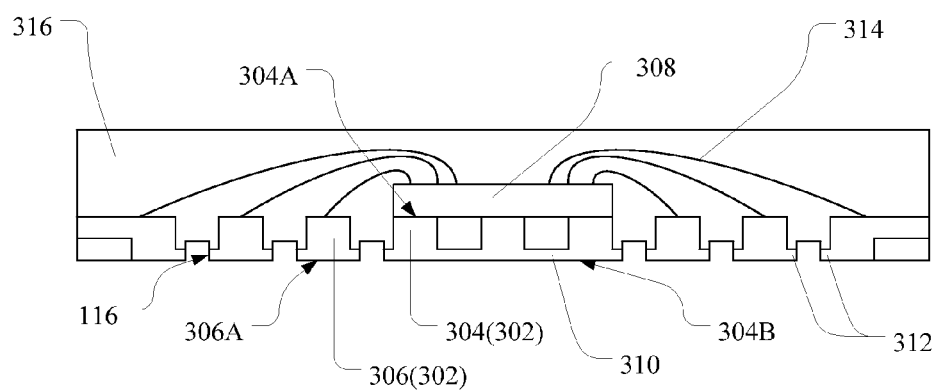

Please refer to FIG. 6. A separation step is then preformed. The extending portions 310 between the chip pads 304 and the bond pads 306 and the extending portions 310 between the bond pads 306 themselves are partially removed so that the chip pads 304 and the bond pads 306 are electrically isolated and the bond pads 306 themselves are electrically isolated with each other. In some embodiments of the present invention, the method of partially removing the extending portions 310 is selected from a group consisting of sawing, etching, punching, and any combinations thereof. Since the thickness and the width of the extending portions 310 are both smaller than the thickness and the width of the pads 302, and the bottom surface 310A of the extending portions 310 is exposed on the encapsulant 316, a smaller depth of removal of the extending portions 310 either by sawing, etching or punching is enough to easily disconnect the extending portions 310 to make the pads 302 separate from each other so that damage to the bonding wires 314 due to a deep removal can be prevented. In order not to damage the pads 302 in the separation step, an appropriate distance may be maintained between the pads 302 and the location of sawing, etching or punching. As shown in FIG. 6, after partially removing the extending portions 310, each of the bond pads 306 and at least one of the bond pads 306 or one of the chip pads 304 adjacent thereto each has a second extending portion 312 formed therebetween and corresponding to each other, and every two of the second extending portions 312 corresponding to each other are separated by a groove 116. It is worth mentioning that the purpose of the separation step is to make the chip pads 304 and the bond pads 306 electrically isolated and to make the bond pads 306 themselves electrically isolated with each other, so whether the extending portions 310 between the pads 302 remain or not, the purpose can all be achieved; the method of the present embodiment is not to limit the present invention. Furthermore, the extending portions 310 between the chip pads 304 do not need to be removed; more specifically, the chip pads 304 can remain connected to each other, which can increase the exposed bottom area of the metal so as to facilitate heat dissipation of the chip 308. After the separation step, the removal of the extending portions 310 and part of the encapsulant 316 will form a plurality of grooves, especially when sawing or punching is used for the separation step, in which the extending portions 310 and the adjacent encapsulant 316 will be removed together.

Figure 7:
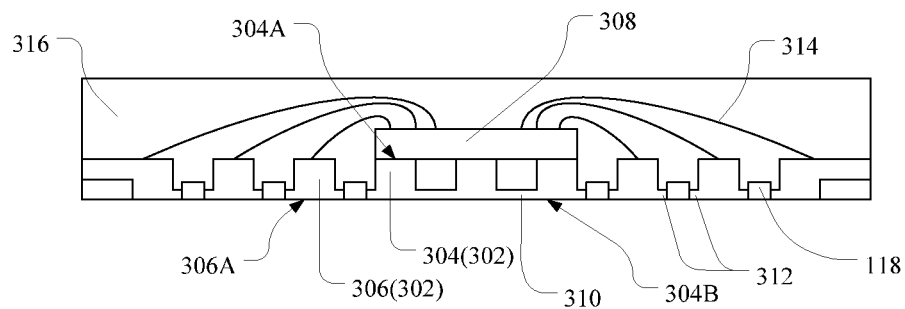

Referring to FIG. 7, when the grooves 116 are formed in the above-mentioned separation step as shown in FIG. 6, an insulating material 118 can be filled into the grooves 116 optionally. The material of the insulating material 118 can be solder resist, polyimide, etc.

Figure 8:
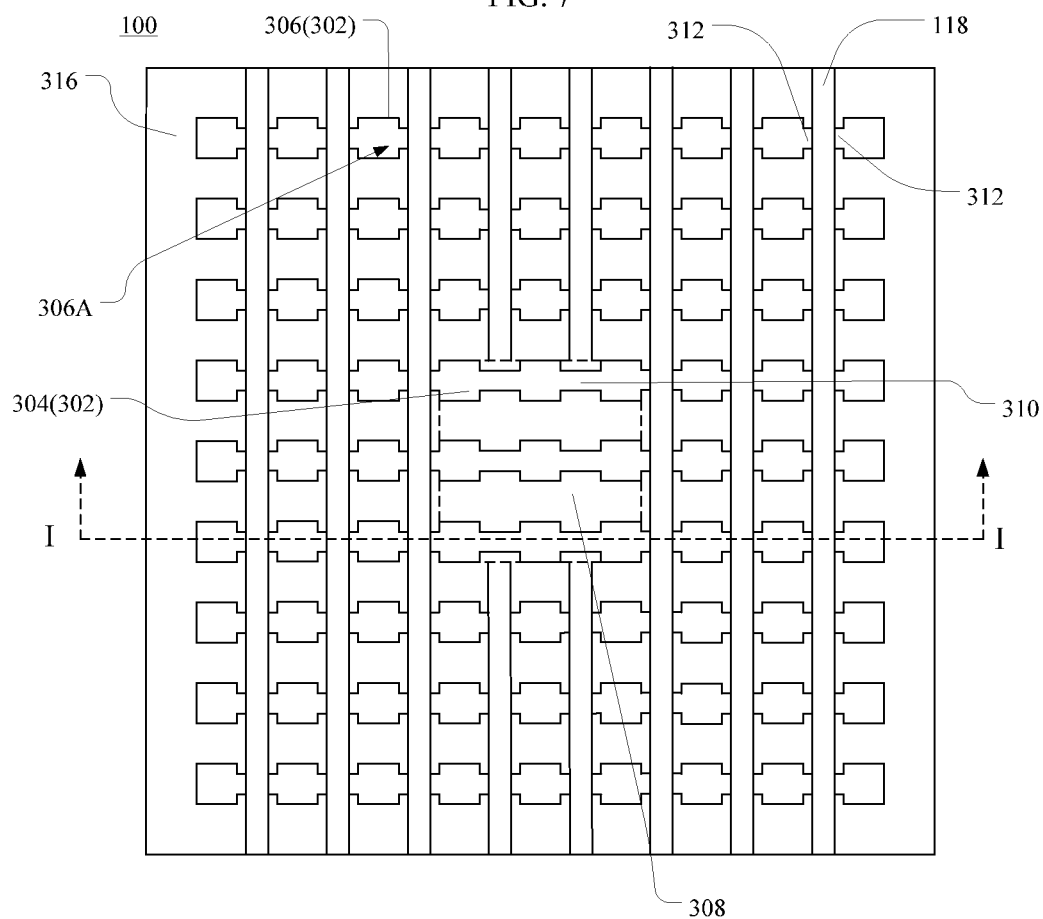
FIG. 8 is a bottom view illustrating a quad flat no-lead package according to one embodiment of the present invention.

Please also refer to FIG. 8, which is a bottom view illustrating a quad flat no-lead package 100 according to an embodiment of the present invention, wherein FIG. 7 is a cross-sectional view along line I-I of FIG. 8.

In summary, for the quad flat no-lead package and the manufacturing method thereof of the present invention, since the bond pads are arranged in an array, the quantity of the bond pads can be increased without affecting the package area and volume compared with the conventional leadframe-type quad flat no-lead package in which the bond pads are disposed around the edges of the package. Moreover, in the quad flat no-lead package and the manufacturing method thereof of the present invention, the chip pads and the bond pads are all arranged in an array, thus the quantities of the chip pads and the bond pads can be adjusted according to the chip sizes and the quantity of I/O contacts required, namely they are applicable to a variety of chip sizes and pin counts. Therefore, the lead frame of the present invention has the advantages of modularization and universal applicability.

With the examples and explanations mentioned above, the features and spirits of the invention are hopefully well described. More importantly, the present invention is not limited to the embodiment described herein. Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A quad flat no-lead package, comprising:
   an encapsulant, having a package bottom surface;
   a plurality of chip pads, disposed in the encapsulant, wherein each of the chip pads is connected to at least one of the chip pads adjacent thereto by a first extending portion extending along the package bottom surface, and a bottom surface of each of the chip pads is exposed on the package bottom surface;
   a plurality of bond pads, disposed in the encapsulant, wherein the plurality of chip pads and the plurality of bond pads are arranged in an array, the plurality of chip pads are disposed at a center of the array and each of the bond pads are disposed around the plurality of chip pads, each of the bond pads and at least one of the bond pads or one of the chip pads adjacent thereto each has a second extending portion extending along the package bottom surface formed therebetween and corresponding to each other, every two of the second extending portions corresponding to each other are separated by a groove, and the groove exposes one end of each of the second extending portions, a bottom surface of each of the bond pads is exposed on the package bottom surface;
   a chip, disposed in the encapsulant and mounted directly on a top surface of the chip pads away from the package bottom surface, the chip electrically coupled to the respective bond pads.

2. The quad flat no-lead package of claim 1, wherein bottom surfaces of the first extending portions and the second extending portions are exposed on the package bottom surface.

3. The quad flat no-lead package of claim 1, wherein a thickness of each of the first extending portions is smaller than a thickness of each of the chip pads, and a thickness of each of the second extending portions is smaller than a thickness of each of the bond pads.

4. The quad flat no-lead package of claim 1, wherein a width of each of the first extending portions is smaller than a width of each of the chip pads, and a width of each of the second extending portions is smaller than a width of each of the bond pads.

5. The quad flat no-lead package of claim 2, wherein a thickness of each of the first extending portions is smaller than a thickness of each of the chip pads, and a thickness of each of the second extending portions is smaller than a thickness of each of the bond pads.

6. The quad flat no-lead package of claim 1, wherein the grooves are formed by a method selected from a group consisting of sawing, etching, punching and any combinations thereof.

7. The quad flat no-lead package of claim 1, further comprising an insulating material filled in the grooves.

* * * * *